(12) United States Patent
Weisenberger

(10) Patent No.: US 10,155,359 B2
(45) Date of Patent: *Dec. 18, 2018

(54) LIGHTWEIGHT THERMAL MANAGEMENT MATERIAL FOR ENHANCEMENT OF THROUGH-THICKNESS THERMAL CONDUCTIVITY

(71) Applicant: The University of Kentucky Research Foundation, Lexington, KY (US)

(72) Inventor: Matthew C. Weisenberger, Georgetown, KY (US)

(73) Assignee: The University of Kentucky Research Foundation, Lexington, KY (US)

( * ) Notice: Subject to any disclaimer, the term of this patent is extended or adjusted under 35 U.S.C. 154(b) by 475 days.

This patent is subject to a terminal disclaimer.

(21) Appl. No.: 14/105,245

(22) Filed: Dec. 13, 2013

(65) Prior Publication Data

US 2015/0314562 A1 Nov. 5, 2015

Related U.S. Application Data

(62) Division of application No. 12/109,735, filed on Apr. 25, 2008, now Pat. No. 8,632,879.

(51) Int. Cl.
*B32B 7/06* (2006.01)
*B32B 5/02* (2006.01)
(Continued)

(52) U.S. Cl.
CPC .......... *B32B 7/06* (2013.01); *B32B 5/02* (2013.01); *B32B 27/06* (2013.01); *B32B 37/203* (2013.01);
(Continued)

(58) Field of Classification Search
CPC .... B32B 5/00; B32B 5/02; B32B 5/12; B32B 5/22; B32B 5/24; B32B 5/26; B32B 5/28; B32B 7/06; B32B 27/06; B32B 37/26; B32B 37/203; B32B 2037/268; B32B 2037/302; B32B 2264/108; B32B 2405/00; B82Y 30/00; C08J 5/005; C08J 2363/00;
(Continued)

(56) References Cited

U.S. PATENT DOCUMENTS

2003/0017331 A1* 1/2003 Okochi .............. C08G 18/3284
428/343
2003/0205368 A1* 11/2003 Chiu .................. H01L 23/3737
165/185

(Continued)

*Primary Examiner* — Jennifer A Steele
(74) *Attorney, Agent, or Firm* — King & Schickli, PLLC

(57) ABSTRACT

A flexible sheet of aligned carbon nanotubes includes an array of aligned nanotubes held in a polymer matrix material. The carbon nanotubes have an average length of between about 50 microns and about 500 microns. The polymer matrix has an average thickness of between about 10 microns and about 500 microns. The flexible sheet has a density of about 0.2 to about 1.0 g/cc and includes between about 98 to about 60 weight percent aligned carbon nanotubes and between about 2 and about 40 weight percent polymer. A tape of aligned carbon nanotubes, a method for producing a tape of aligned carbon nanotubes, a method of producing the flexible aligned carbon nanotube sheet material and a method of increasing unidirectional heat conduction from a work piece are also disclosed.

20 Claims, 5 Drawing Sheets

(51) Int. Cl.
*B32B 27/06* (2006.01)
*B32B 37/20* (2006.01)
*B32B 37/26* (2006.01)
*C08J 5/00* (2006.01)
*B82Y 30/00* (2011.01)
*B29C 63/08* (2006.01)
*H01L 23/373* (2006.01)

(52) U.S. Cl.
CPC ............. *B32B 37/26* (2013.01); *B82Y 30/00* (2013.01); *C08J 5/005* (2013.01); *B29C 63/08* (2013.01); *B32B 2037/268* (2013.01); *B32B 2264/108* (2013.01); *B32B 2307/302* (2013.01); *B32B 2405/00* (2013.01); *C08J 2363/00* (2013.01); *H01L 23/373* (2013.01); *H01L 2924/0002* (2013.01); *Y10T 428/14* (2015.01); *Y10T 428/1452* (2015.01); *Y10T 428/1457* (2015.01); *Y10T 428/1476* (2015.01); *Y10T 428/24995* (2015.04); *Y10T 428/249945* (2015.04); *Y10T 428/249952* (2015.04)

(58) Field of Classification Search
CPC ........... H01L 2924/0002; H01L 23/373; Y10T 428/1457; Y10T 428/249921; Y10T 428/1476; Y10T 428/1452; Y10T 428/266; Y10T 428/26; Y10T 428/14; Y10T 428/249942; Y10T 428/249945; Y10T 428/24995; Y10T 428/249952; B29C 63/08
USPC ....... 428/40.1–42.3, 200, 299.1, 343–355 N, 428/149–151, 299; 977/742–753, 977/778–787, 833
See application file for complete search history.

(56) References Cited

U.S. PATENT DOCUMENTS

| | | | | |
|---|---|---|---|---|
| 2003/0219591 | A1* | 11/2003 | Bany | C08G 18/5024 428/343 |
| 2004/0266063 | A1* | 12/2004 | Montgomery | B82Y 10/00 438/119 |
| 2005/0148984 | A1* | 7/2005 | Lindsay | A61F 13/5611 604/387 |
| 2006/0228542 | A1* | 10/2006 | Czubarow | H01L 23/3737 428/323 |
| 2008/0128122 | A1* | 6/2008 | Huang | F28D 20/02 165/185 |
| 2010/0075024 | A1* | 3/2010 | Ajayan | C08K 7/24 427/66 |

* cited by examiner

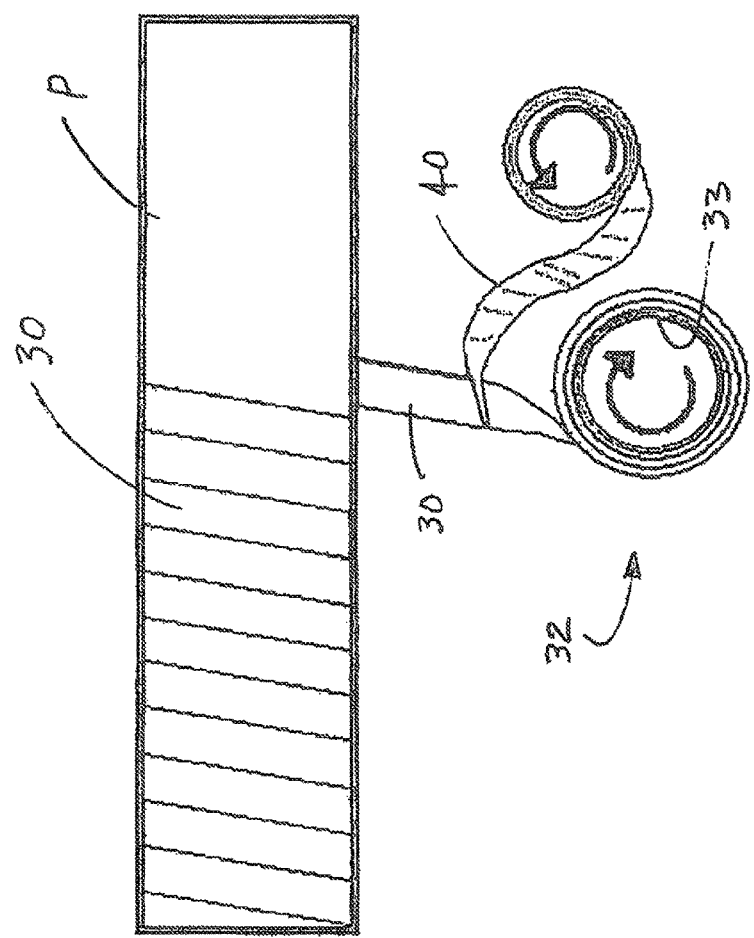

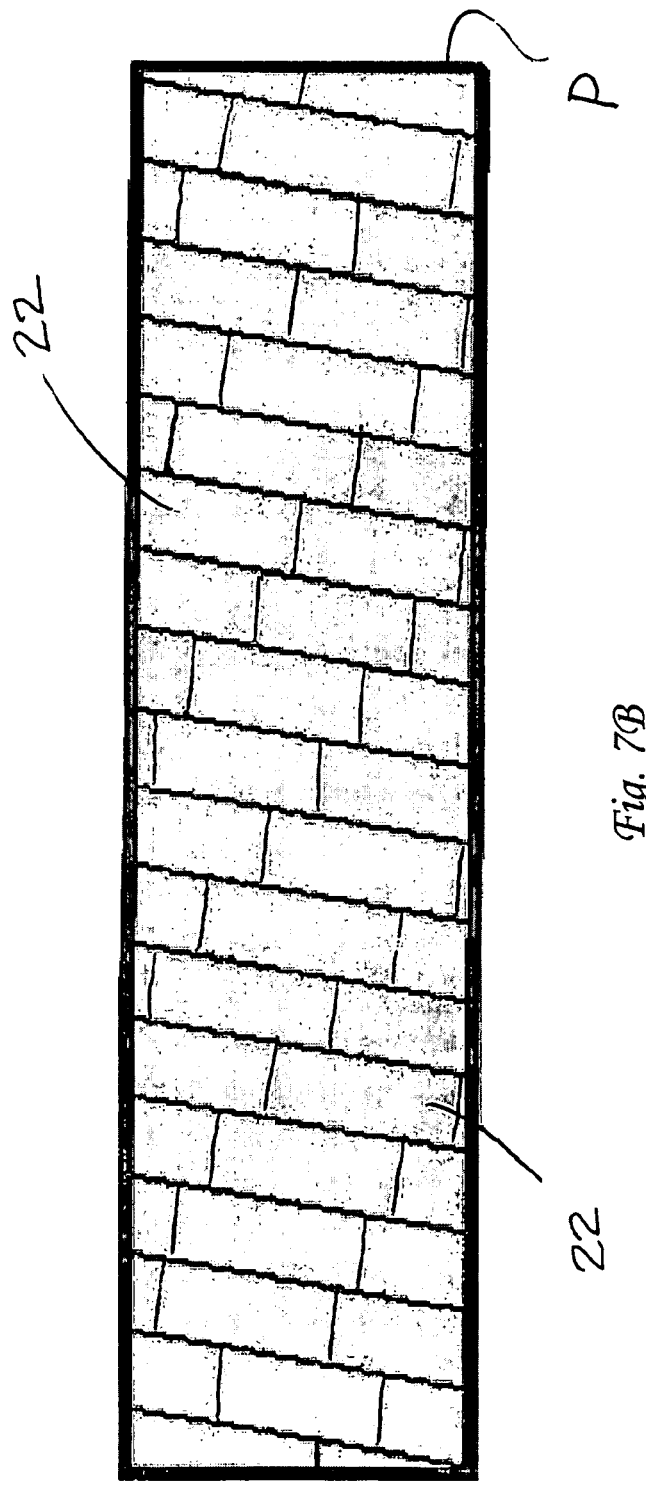

ially and industrial applicability of the invention

LIGHTWEIGHT THERMAL MANAGEMENT MATERIAL FOR ENHANCEMENT OF THROUGH-THICKNESS THERMAL CONDUCTIVITY

This utility patent application is a divisional of U.S. patent application Ser. No. 12/109,735 filed on Apr. 25, 2008, the entirety of the disclosure of which is incorporated herein by reference.

This invention was made with government support under contract W31P4Q-07-C-0075 awarded by US Department of Army. The government has certain rights in the invention.

TECHNICAL FIELD AND INDUSTRIAL APPLICABILITY OF THE INVENTION

The present invention relates generally to thermal management materials and, more particularly, to thermal management materials incorporating aligned carbon nanotubes held in a polymer matrix and methods for producing such materials.

BACKGROUND OF THE INVENTION

A carbon nanotube is a microscopic, hollow filament comprised of carbon atoms arranged in the shape of a cylinder. Carbon nanotubes are typically on the order of nanometers in diameter but may be produced with lengths of up to several hundred microns. Carbon nanotubes possess high electrical and thermal conductivities in the direction of the longitudinal axis of the carbon nanotubes. Individual carbon nanotubes have displayed thermal conductivities of 3000 W/m-° K and higher at room temperature.

It is known to use composites of aligned carbon nanotubes and a polymer matrix in thermal management applications. Examples of such composite used for thermal applications are found in U.S. Pat. No. 6,428,890 to Ting and in published U.S. Patent Applications 2006/0279191 to Gohegan et al and 2007/0116626 to Pan et al. The present invention relates to improved composite materials made from carbon nanotubes and a polymer matrix including continuous tapes of such material as well as to methods of their production. In addition, the present invention relates to a method of increasing unidirectional heat conduction from a work piece.

SUMMARY OF THE INVENTION

In accordance with the purposes of the present invention as described herein, a method is provided for producing an aligned carbon nanotube tape. The method comprises the steps of preparing strips of aligned carbon nanotube arrays and splicing those strips of aligned carbon nanotube arrays together end-to-end on a flexible support to form a tape. In addition the method includes covering the tape with a peel ply (i.e. non-permanently adhered film) so that the spliced strips are covered on a first face by the support and on a second, opposite face, by the peel ply. The method also includes the step of winding the covered tape into a roll.

More specifically describing the invention, the preparing step includes the steps of growing an array of aligned carbon nanotubes on a substrate and fixing the aligned carbon nanotubes in alignment. The fixing step specifically includes the steps of infiltrating the array of aligned carbon nanotubes on the substrate with a matrix material such as a polymer and allowing the polymer to partially cure.

In addition, the preparing step may further include the steps of slitting the polymer-infiltrated aligned carbon nanotube arrays into strips of width W and removing strips of width W from the substrate. Alternatively the multiwalled carbon nanotubes can be grown on substrates of pre-determined width W, and then infiltrated with polymer. The removing step may be performed by shaving away the carbon nanotubes from the substrate or etching away the substrate. Or, the substrate may be left in place.

In accordance with an additional aspect of the present invention, a tape of aligned carbon nanotubes is provided. The tape comprises a nanotube layer including aligned carbon nanotubes held in a polymer matrix. A flexible support covers the first face of the nanotube layer. In addition, a peel ply covers a second opposite face of the nanotube layer. In one possible embodiment the aligned carbon nanotubes are multi-walled carbon nanotubes.

The matrix used in the tape may be made from a material selected from a group consisting of any of a series of thermosetting or thermoplastic resins, including epoxy, vinyl ester, silicone, cyanate ester, bismaleimide (BMI), polyimide, polyolefin, polyurethane, phenolics, acrylics, polyester; carbonizable resins such as polyfurfural, pitch, or tars; ceramic or metallic matrices including silicon carbide, aluminum, and solders; or rubbers and mixtures thereof. The flexible support may be made from a material selected from a group consisting of polytetrafluoroethylene (PTFE), fiber reinforced PTFE sheet, polyester, polyolefins, coated paper, coated fabric, wax, silicone flexible metals or rubbers and mixtures thereof. The peel ply may be made from a material selected from a group consisting of polytetrafluoroethylene, polyester, nylon, coated paper, coated fabric, silicone, wax, polyolefin, metals or rubbers and mixtures thereof. An adhesive layer may be provided between the nanotube layer and the peel ply. That adhesive is selected from a group consisting of thermosets, latexs, rubbers, acrylics, pressure sensitive adhesives, silicones or other natural or synthetic adhesives and mixtures thereof.

In accordance with yet another aspect of the present invention, a method is provided for increasing unidirectional heat conduction from a work piece. That method may be broadly and generally described as comprising the step of wrapping the work piece with a continuous tape of aligned carbon nanotubes. That continuous tape of aligned carbon nanotubes includes a support layer, a nanotube layer and, optionally, a peel ply layer. Accordingly, the method may be more specifically described as including the steps of removing the peel ply layer from the tape (if applicable), winding the tape around the work piece with the nanotube layer wound around and engaging the work piece and then unwrapping the support layer from the nanotube layer.

In one possible embodiment, the method further includes providing an adhesive between the nanotube layer and the work piece. In any of the embodiments, the method may further include the curing of the continuous tape following the unwrapping of the support layer. Finally, the method may include the selecting of the work piece from a group of structures including a rocket motor casing, a microprocessor chip, laser equipment, filament-wound composites, laminate composites, electronics components fiber reinforced composites, sheet molded materials and curved and/or planar interfaces between heat sources and heat sinks.

In accordance with yet another aspect of the present invention a method is provided of producing a flexible aligned carbon nanotube sheet material. The method may be broadly described as comprising the steps of synthesizing an array of aligned carbon nanotubes on a substrate, infiltrating that array of aligned carbon nanotubes with a polymer, allowing the polymer to partially cure or solidify and removing the flexible aligned carbon nanotube sheet material from the substrate. Further, the invention includes a flexible sheet of aligned carbon nanotubes comprising an array of aligned carbon nanotubes held in a polymer matrix material wherein the carbon nanotubes have an average length of between about 50 micron and about 500 micron, the polymer matrix has an average thickness of between about 10 micron and about 500 micron and the flexible sheet has a density of between about 0.2 to about 1.0 g/cc and includes between about 98 to about 60 weight percent aligned carbon nanotubes and between about 2 and about 40 weight percent polymer. In one particularly useful embodiment of the present invention, the polymer matrix is a B-staged epoxy.

In another useful embodiment the flexible sheet of aligned carbon nanotubes includes a peel ply covering a first face of the aligned carbon nanotubes held in the polymer matrix.

In the following description there is shown and described several different embodiments of this invention, simply by way of illustration of some of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated herein and forming a part of the specification, illustrate several aspects of the present invention and together with the description serve to explain certain principles of the invention. In the drawings:

FIGS. 7A and 7B are schematical side elevational views illustrating the winding of the tape onto a work piece.

Reference will now be made in detail to the present preferred embodiments of the invention, examples of which are illustrated in the accompanying drawings.

DETAILED DESCRIPTION OF THE PREFERRED EMBODIMENTS OF THE INVENTION

Figure 1:
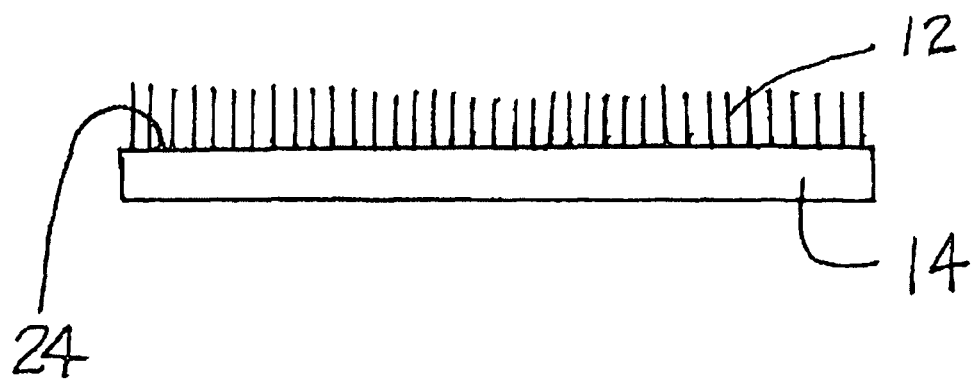
FIG. 1 is a partially schematical side elevational view illustrating the formation of aligned carbon nanotubes on a support substrate.

Reference is now made to FIG. 1 illustrating an array of aligned carbon nanotubes 12 as grown and supported on a support substrate 14. The aligned carbon nanotubes may be grown in accordance with procedures well known in the art. One particularly useful process for the growing of aligned carbon nanotubes is set forth and described in U.S. Pat. No. 7,160,531 to Jacques et al. This patent is owned by the assignee of the present invention and the full disclosure made in that patent is hereby incorporated into this document by reference.

Figure 2:
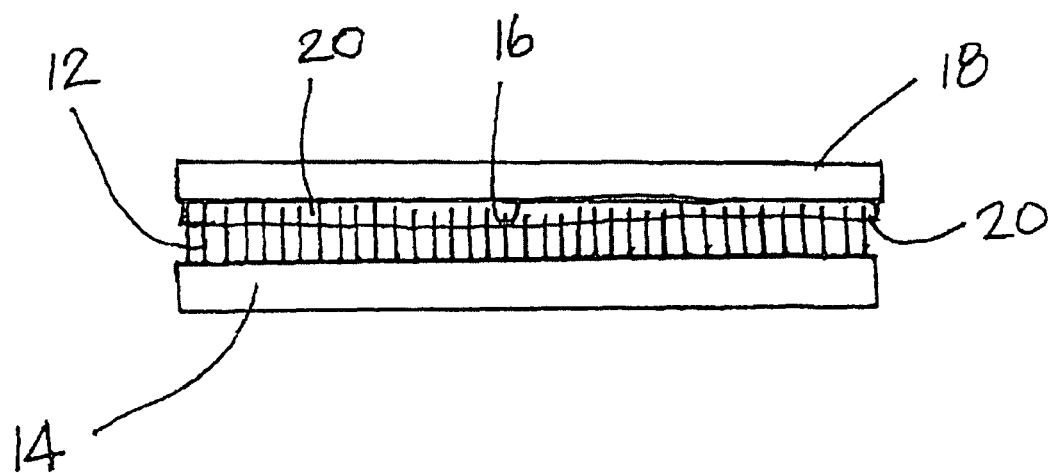
FIG. 2 is a view similar to FIG. 1 but illustrating the infiltration of those aligned carbon nanotubes with a polymer matrix material.

FIG. 2 illustrates how the individual nanotubes of the array 12 are fixed in vertical alignment. Specifically, one face 16 of a flexible support 18 is coated in a polymer material 20. The flexible support 18 may be made from any appropriate material including but not limited polytetrafluoroethylene (PTFE), fiber reinforced PTFE sheet, polyester, polyolefin, coated paper, coated fabric, wax, silicone flexible metal or rubber and mixtures thereof. The polymer material layer 20 may be made from any appropriate polymer matrix material including but not limited to any of a series of thermosetting or thermoplastic resins, including epoxy, vinyl ester, silicone, cyanate ester, bismaleimide (BMI), polyimide, polyolefin, polyurethane, phenolic, acrylic, polyester; carbonizable resin such as polyfurfural, pitch, or tar; or rubber and mixtures thereof. Typically, the flexible support 18 has a vertical thickness of between about 100 microns and about 1 mm while the polymer layer 20 has a vertical thickness of between about 10 microns and about 500 microns. After coating, the face 16 of the flexible support 18 coated in the polymer material 20 is placed over the exposed face of the aligned carbon nanotubes of the array 12 in order to infiltrate the array with the polymer (see FIG. 2). Appropriate pressure may be applied to force the polymer layer 20 down into the array 12 of carbon nanotubes. Once the space between the carbon nanotubes in the array 12 has been sufficiently infiltrated with the polymer 20, the polymer is allowed to partially cure and/or solidify. Partial curing is commonly known as B-staging. The resulting polymer layer 20 holds the carbon nanotubes in the array 12 in alignment.

Figure 3:
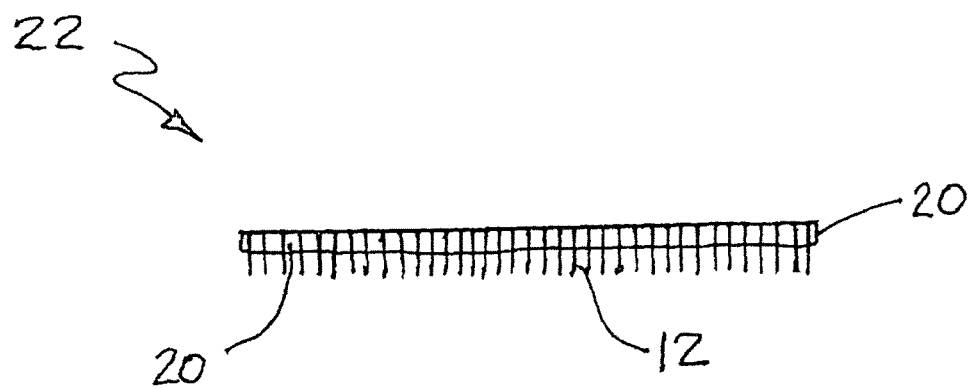
FIG. 3 is a view similar to FIGS. 1 and 2 but illustrating the removal of the substrate and the formation of a flexible sheet of aligned carbon nanotubes.

The next steps of the process are illustrated in FIG. 3. After partial curing or solidifying of the polymer layer 20, the non-stick support layer 18 is peeled away. This is followed by the separating or removing of the substrate 14 from the flexible aligned carbon nanotube sheet material 22 that comprises the carbon nanotube array 12 held in the polymer layer 20. This may be done by a number of processes including but not limited to shaving the array 12 from the substrate 14 and etching the substrate away with an acid. In the shaving process a sharp blade is held at a shallow angle to and against the surface 24 of the substrate 14 (see FIG. 1). As the blade is pushed forward, the carbon nanotubes of the array 12 are cut free from the substrate 14 to provide the sheet of aligned carbon nanotubes 22. During shaving, it is advantageous to temporarily allow the sheet 22 to roll up over a cylindrical, plastic roll. The sheet 22 may be subsequently unrolled for further processing or use. The etching process may be used, for example, where the substrate 14 is formed from metals. More specifically, hydrochloric acid may be used to dissolve the steel substrate and remove it without adversely affecting or damaging the carbon nanotube array 12, the polymer layer 20 or the flexible support 18.

The sheet 22 of vertically aligned carbon nanotubes illustrated in FIG. 3 may be used as a final product. Typically, the carbon nanotubes incorporated into the array 12 of the sheet 22 have an average vertical length of between about 50 microns and about 500 microns. Typically, the polymer matrix layer 20 has an average vertical thickness of between about 10 microns and about 500 microns. Further, the sheet 22 has a density of between about 0.2 and about 1.0. g/cc and includes between about 98 and about 60 weight percent aligned carbon nanotubes and between about 2 and about 40 weight percent polymer.

Figure 4:
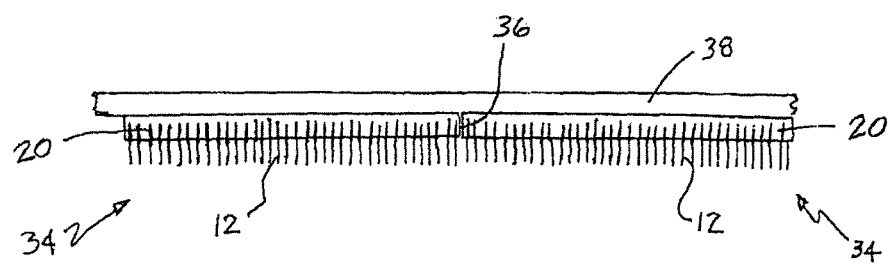
FIG. 4 is a view similar to the earlier Figures but illustrating the formation of a continuous tape from strips of the flexible sheet of aligned carbon nanotube material.
Figure 6:
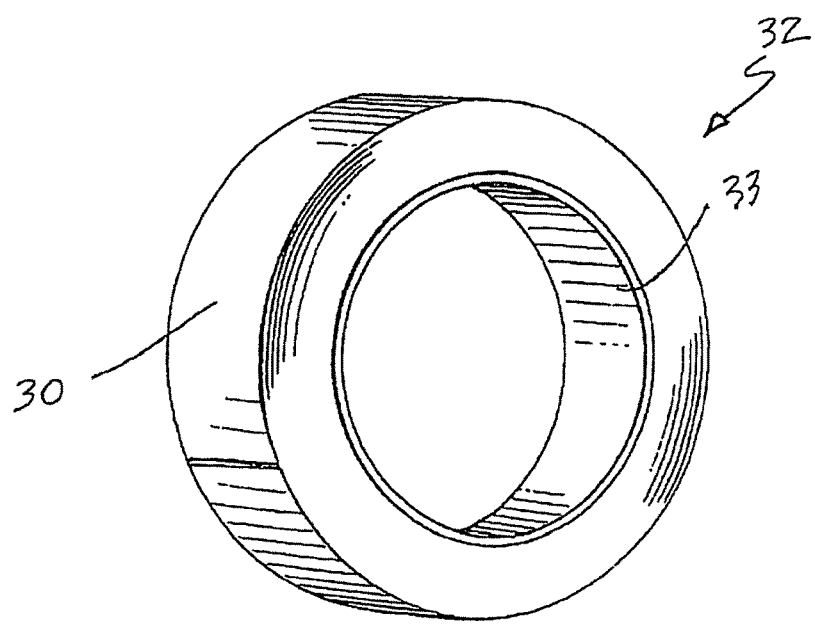
FIG. 6 is a perspective view of an aligned carbon nanotube tape in the form of a roll.

Alternatively, a continuous tape 30 of continuous vertically aligned carbon nanotubes (note roll 32 of tape 30 supported on a support tube 33 illustrated in FIG. 6) may be made from the sheet of aligned carbon nanotubes 22 illustrated in FIG. 3. More specifically, the flexible sheet 22 may be slit into strips 34 of a desired width W. The strips 34 are then aligned end-to-end as illustrated in FIG. 4 to form the tape 30. More specifically, the abutting ends 36 of the strips 34 are aligned on and held in place by an additional, thin, continuous flexible support layer 38. In one possible embodiment the support layer 38 is made of the same material as the flexible support 18. The support layer 38 is continuous and bridges the abutting ends 36 of the adjacent strips. By laminating the support layer 38 to the aligned strips 34 with an appropriate adhesive, heat fusion or by other means, a continuous tape 30 is provided.

Figure 5:
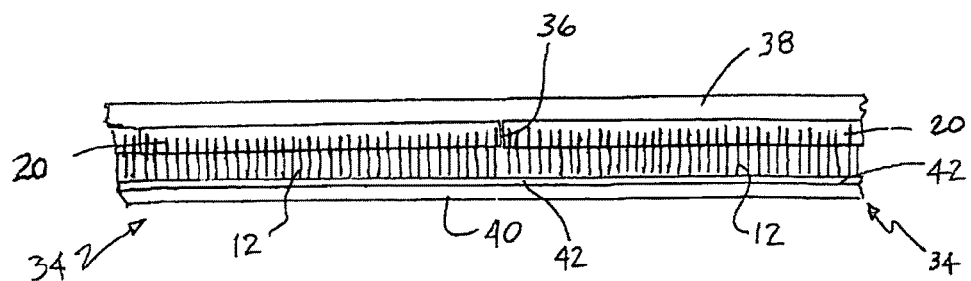
FIG. 5 is a view similar to FIG. 4 but showing the addition of an optional peel ply layer to the continuous tape.

As illustrated in FIG. 5, for certain applications it could be desirable to add a peel ply 40 to the opposite or otherwise exposed face of the carbon nanotube array 12. The peel ply 40 may be made from substantially any appropriate material including but not limited to polytetrafluoroethylene, polyester, nylon, coated paper, coated fabric, silicone, wax, polyolefin, metal or rubber and mixtures thereof. An adhesive layer 42 may be provided between the carbon nanotube array 12 and the peel ply 40 in order to hold the peel ply in position. The adhesive layer 42 may be made from, for example, thermosets, latexs, rubbers, acrylics, pressure sensitive adhesives, silicones or other natural or synthetic adhesives and mixtures thereof.

The following example is presented to further illustrate the invention, but it is not to be considered as limited thereto.

EXAMPLE

This example relates to the production of films using an epoxy matrix within CVD-grown multiwall carbon nanotubes grown on a quartz substrate to approximately 100-500 microns in length. Apart from the multiwall carbon nanotube (MWNT) synthesis, the method is simple, straight-forward, and effective, which is an important part of its attractiveness.

1. Multiwall carbon nanotubes were grown, primarily on one side, of quartz substrates (4"×36"×⅛") to a thickness of between 100 and 500 microns. The process used is generally outlined in U.S. Pat. No. 7,160,531. The parameters of the process were varied to produce MWNTs of longer length.

2. The cooled MWNT-covered quartz substrates were then laid flat with the MWNT arrays facing up. A thin layer of pre-mixed (epoxy+hardener) was applied to a PTFE coated flexible sheet (pre-cut to completely cover the exposed MWNT array), and quickly placed over the exposed MWNTs with the wet-epoxy side face-down onto the exposed MWNT array. A weight was placed completely over the dry side of the PTFE sheet (facing up) to press the epoxy into the MWNT array evenly.

3. The epoxy was then allowed to infiltrate into the MWNT. (This process likely occurs very quickly and is accelerated by the capillary action of the interstices of the MWNT array.)

4. Without removing the PTFE sheet, the epoxy was partially cured by allowing it to react, at room temperature, for 5 days. This is commonly known as B-staging of the epoxy, after which the epoxy was a sticky solid. (B-staging can be sped up significantly by the addition of heat, or by changing the epoxy chemistry. However, if the cured epoxy is brittle, it must be cooled quickly to prevent complete curing.)

A desirable feature of the matrix was that it be flexible enough to facilitate the bending stresses applied during the removal of the infiltrated array from the substrate. This was subtly addressed by only using a thin layer of epoxy during infiltration. If a thick layer of epoxy were allowed to soak into the array, completely wetting it, the resulting array would adhere to the substrate. The thin layer of epoxy doesn't completely wet the array, but imparts enough mechanical integrity to sufficiently hold it together. The epoxy-starved array is ideally suited for application as inter-laminar through-thickness heat-transfer material in epoxy matrix composites because it also serves to soak up excess epoxy used during the processing of the laminated or filament-wound composites.

5. The B-staged epoxy infiltrated MWNT array was then removed from the underlying quartz substrate in a single large piece by "shaving" it from the substrate. Here a sharp razor was held at a shallow angle to and against the quartz surface, and pushed forward, thus cutting the infiltrated array free from the quartz in one large piece.

It should be noted that during the MWNT synthesis, the MWNT array is inherently bound to the quartz substrate beneath. Attempts to remove the un-infiltrated array from the quartz substrate result in breaking up of the array into tightly scrolled, discrete chunks. Similarly, as-grown MWNT arrays on metallic substrates are tightly bound.

The resulting free-standing B-staged epoxy infiltrated MWNT arrays, were in a sheet form and flexible enough to be conformed over curved surfaces or cut into desired shapes by a shaped-cutter technique, or let flat. A final curing of the epoxy can then be administered by simply heating to approximately 150° C. for 1 hr. This hardens the epoxy matrix, locking-in the desired shape of the film. It should be noted that the flexibility and softness of the B-staged films is desirable to impart the films with the conformability necessary to tightly fit the interface in which they are placed. A high degree of surface contact with little void space is desirable for thermal conductivity through an interface between parts (such as between a CPU chip and its heat sink).

Yet another aspect of the present invention is a method of increasing unidirectional heat conduction from a work piece. This method may be broadly described as comprising the step of wrapping the work piece with a continuous tape of aligned carbon nanotubes. The method is illustrated in detail in FIGS. 7A and 7B. As illustrated in FIG. 7A, the method comprises removing the peel ply layer 40 from the tape 30 as the tape is wound around the work piece P with the carbon nanotube array layer 12 engaging the work piece P. The tape 30 may be wrapped in a "filament-winding" manner so as to provide a continuous wound surface with edge to edge engagement of the tape and no overlap. As noted above, the tape 30 incorporates a B-staged polymer 20 and is flexible enough to be conformed to the curved surfaces of the work piece P. After winding the tape 30 over the surface of the work piece P, the support layer 38 is removed by unwrapping (see FIG. 7B) leaving the nanotube material 22 exposed. This is done while leaving the strips of aligned carbon nanotube material 22 in position completely wrapped around the work piece P. The wound work piece P is then subjected to a final curing of the polymer 20. For example, where epoxy is utilized for the polymer 20 the final curing could be administered by simply heating to approximately 150° C. for 1 hour. This locks the tape 30 into a work piece conforming shape providing a tight interface and high degree of surface contact between the carbon nanotube array 12 and the work piece P. By providing tight contact and minimizing void space high thermal conductivity is provided. As a consequence, heat is rapidly conducted from the work piece P through the carbon nanotube array. It should be appreciated that the work piece P may take the form of substantially any number of structures including but not limited to a microprocessor chip, a rocket motor casing, laser equipment, filament-wound composites, laminate composites, electronics components, fiber reinforced composites, sheet molded materials and curved and/or planar interfaces between heat sources and heat sinks.

The foregoing description of the preferred embodiments of the present invention have been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled. The drawings and preferred embodiments do not and are not intended to limit the ordinary meaning of the claims in their fair and broad interpretation in any way.

What is claimed:

1. A flexible roll of tape of aligned carbon nanotubes, comprising:
    a flexible continuous nanotube layer comprising vertically aligned carbon nanotubes with a partially cured polymer infiltrated in the interstices of the nanotubes, wherein the polymer partially fills the vertical length of the vertically aligned nanotubes;
    a non-stick flexible support covering a first face of the nanotube layer; and
    a peel ply covering a second face of said nanotube layer, wherein the second face comprises a shallow angle cut.

2. The tape of claim 1, wherein said aligned carbon nanotubes are multiwalled nanotubes.

3. The tape of claim 1, wherein said peel ply is made from a material selected from a group consisting of polytetrafluoroethylene, polyester, nylon, coated paper, coated fabric, silicone, wax, polyolefin, metal, rubber and mixtures thereof.

4. The tape of claim 3, further including an adhesive layer between said nanotube layer and said peel ply.

5. The tape of claim 4, wherein said adhesive is selected from a group consisting of a thermoset, a latex, a rubber, an acrylic, a pressure sensitive adhesive, a silicone and mixtures thereof.

6. The tape of claim 1 wherein said partially cured polymer is a partially cured polymer matrix material selected from a group consisting of a thermosetting resin, epoxy, vinyl ester, silicone, cyanate ester, polymide, polyolefin, polyurethane, phenolics, polyfurfural and mixtures thereof.

7. The tape of claim 1, wherein the non-stick flexible support group consisting of polytetrafluoroethylene (PTFE), fiber reinforced PTFE sheet, polyester, polyolefins, coated paper, coated fabric, wax, silicone, flexible metals or rubbers and mixtures thereof.

8. A method of producing an aligned carbon nanotube tape of claim 1, comprising:
    preparing strips of aligned carbon nanotube; and
    splicing said strips of aligned carbon nanotube together end-to-end on a flexible support to form a tape.

9. The method of claim 8 further including covering said tape with a peel ply so that said spliced strips are covered on a first face by said support and on a second, opposite face by said peel ply.

10. The method of claim 9, including winding said covered tape into a roll.

11. The method of claim 8, wherein said preparing step includes steps of:
    growing an array of aligned carbon nanotubes on a substrate; and
    fixing said carbon nanotubes in alignment.

12. The method of claim 11, wherein said fixing step includes steps of:
    coating a first face of a flexible support layer with a polymer;
    placing said first face of said flexible support layer coated in polymer over an exposed face of said aligned carbon nanotubes in order to infiltrate said array of aligned carbon nanotubes on said substrate with a polymer;
    allowing said polymer to partially cure; and
    removing said flexible support layer.

13. The method of claim 12, wherein said preparing step further includes steps of:
    slitting said set polymer into strips of width W; and
    removing strips of aligned carbon nanotubes of width W from said substrate.

14. The method of claim 13 wherein said removing step includes etching away said substrate.

15. The method of claim 13 wherein said removing step includes shaving said strips of aligned carbon nanotubes from said substrate.

16. A method of increasing unidirectional heat conduction from a work piece, comprising:
    wrapping said work piece with the carbon nanotube tape of claim 1.

17. The method of claim 16, wherein said carbon nanotube tape and a peel ply layer and said method includes steps of:
    removing said peel ply layer from said tape;
    winding said tape around said work piece with said nanotube layer wound around said work piece; and
    unwrapping said support layer from said nanotube layer wound around said work piece.

18. The method of claim 17 including providing an adhesive between said nanotube layer and said work piece.

19. The method of claim 17 including curing said carbon nanotube tape following said unwrapping of said support layer.

20. A method of producing a flexible aligned carbon nanotube tape of claim 1, comprising:
    growing an array of aligned carbon nanotubes on a substrate;
    infiltrating said array of aligned carbon nanotubes on said substrate with a polymer;
    allowing said polymer to partially cure; and
    removing said flexible aligned carbon nanotube sheet material from said substrate.

* * * * *